United States Patent
van Mol et al.

(10) Patent No.: US 7,749,780 B2
(45) Date of Patent: Jul. 6, 2010

(54) POLYMER OPTOELECTRONIC DEVICE AND METHODS FOR MAKING THE SAME

(75) Inventors: Antonius Maria B. van Mol, Eindhoven (NL); Frank Theodorus J. Grob, Eindhoven (NL); Marinus Marc Koetse, Eindhoven (NL)

(73) Assignee: Nederlandse Organisatie Voor Toegepast-Natuurwetenschappelijk Onderzoek Tno, Delft (NL)

( * ) Notice: Subject to any disclaimer, the term of this patent is extended or adjusted under 35 U.S.C. 154(b) by 775 days.

(21) Appl. No.: 11/547,522

(22) PCT Filed: Apr. 1, 2005

(86) PCT No.: PCT/NL2005/000240

§ 371 (c)(1),
(2), (4) Date: Nov. 28, 2006

(87) PCT Pub. No.: WO2005/096405

PCT Pub. Date: Oct. 13, 2005

(65) Prior Publication Data

US 2007/0221911 A1   Sep. 27, 2007

(30) Foreign Application Priority Data

Apr. 1, 2004   (EP) .................................. 04076045

(51) Int. Cl.
    *H01L 35/24*   (2006.01)
    *H01L 27/15*   (2006.01)
(52) U.S. Cl. ............................. 438/22; 438/82; 438/99; 257/79; 257/40; 257/103
(58) Field of Classification Search ................... 438/22, 438/82, 99; 257/79, 40, 103
See application file for complete search history.

(56) References Cited

U.S. PATENT DOCUMENTS 6,657,378 B2 * 12/2003 Forrest et al. ............... 313/503
6,689,458 B1 * 2/2004 Mikoshiba et al. .......... 428/339
2001/0015620 A1   8/2001 Affinito
2007/0026232 A9 * 2/2007 Sasaki et al. ............. 428/411.1

OTHER PUBLICATIONS

Arias et al, "The use of tin oxide thin films as a transparent electrode in PPV based light-emitting diodes", Thin Solid Films, vol. 371, No. 1-2, Aug. 1, 200, pp. 201-206, XP004222541.
Valaski et al; "The influence of electrode material on charge transport properties of polypyrrole thin films", Thin Solid Films, vol. 388, No. 1-2, Jun. 1, 2001, pp. 171-176, XP004234766.
Yadava et al; "Preparation and characterization of transparent conducting tin oxide thin film electrodes by chemical vapor deposition from reactive thermal evaporation of snc12", Materials Chemistry and Physics, vol. 48, 1997, pp. 263- 267, XP002297889.
Kim et al; "Relationship between surface roughness of indium tin oxide and leakage current of organic light-emitting diode", Japanese Journal of Applied Physics, Publication Office Japanese Journal of Applied Physics, vol. 42, No. 4B, Part 2, Apr. 15, 2003, pp. L438-L440, XP001191858.
Anonymous, "Surface metrology guide home, Surface Profile Parameters", Internet Article, 'Online!, Feb. 6, 2004, XP002300009.

* cited by examiner

*Primary Examiner*—Jerome Jackson, Jr.
*Assistant Examiner*—Joseph Nguyen
(74) *Attorney, Agent, or Firm*—Nixon & Vanderhye P.C.

(57) ABSTRACT

The invention relates to a polymer optoelectronic device comprising at least a transparent conductive oxide layer, an active polymer layer, a back electrode layer and a substrate layer, wherein the transparent conductive oxide (TCO) layer has a controlled surface structure which is characterized by having an X-value in the range of from 10 nm to 500 nm, and a Y-value in the range of from 15 nm to 1000 nm, wherein the ratio between the X-value and the Y-value (X/Y) is at most 1, whereby the X-value is defined as the average value of the height of the peaks on the surface, the Y-value is defined as the average peak to peak distance on the surface, and both the X and Y values are measured by means of SEM (Scanning Electron Microscopy) or Atomic Force Microscopy (AFM).

7 Claims, No Drawings

POLYMER OPTOELECTRONIC DEVICE AND METHODS FOR MAKING THE SAME

This application is the U.S. national phase of international application PCT/NL2005/000240, filed 1 Apr. 2005, which designated the U.S. and claims priority of EP 04076045.6, filed 1 Apr. 2004, the entire contents of each of which are hereby incorporated by reference.

The present invention relates to a polymer optoelectronic device such as an organic solar cell or an organic light-emitting diode (OLED), and methods for preparing said device.

Organic solar cells are thin screens that are widely used to generate electric energy from light. They generally comprise an active polymer layer, which is situated between a first electrode which comprises a transparent conductive oxide (TCO) layer and a back electrode layer. The TCO layer is supported by a substrate and allows light to enter the active layer where it is converted into electronic energy.

Organic light-emitting diodes (OLEDs) are semiconductor devices that emit light under influence of an applied voltage. They generally comprise a substrate and an active polymer layer, which is situated between a front electrode in the form of a transparent conductive layer and a back electrode layer. When an appropriate voltage is applied between the transparent conductive layer and the back electrode, light will be produced in the active polymer layer, which light emits through the transparent conductive layer.

It is known that the efficiency of organic solar cells can be improved, for instance, by for example applying on the active layer a diffraction grating by means of an embossing technique. Such technique requires, however, an additional process step, which is commercially not feasible.

Object of the present invention is to provide a polymer optoelectronic device, which is cheaper to make, and which displays an improved efficiency.

Surprisingly, it has now been found that this can be established by applying the TCO layer onto a substrate layer by means of a Chemical Vapour Deposition (CVD) process. The use of a CVD process enables the TCO layer to obtain a surface with an increased and controlled roughness which brings about the emission of diffused light or enhanced light trapping and a considerable improvement in the efficiency of the optoelectronic device. This is especially surprising since it is expected that the combined use of a TCO layer with increased roughness and a very thin active polymer layer will have a detrimental effect on the efficiency of the optoelectronic device because of the expected formation of hotspots and shunts.

Accordingly, the present invention relates to a polymer optoelectronic device comprising at least a transparent conductive oxide layer, an active polymer layer, a back electrode layer and a substrate layer, wherein the transparent conductive oxide (TCO) layer has a controlled surface structure which is characterized by having an X-value in the range of from 10 nm to 500 nm, and a Y-value in the range of from 15 nm to 1000 nm, wherein the ratio between the X-value and the Y-value (X/Y) is at most 1, whereby the X-value is defined as the average value of the height of the peaks on the surface, the Y-value is defined as the average peak to peak distance on the surface, and both the X and Y values are measured by means of Scanning Electron Microscopy (SEM) or Atomic Force Microscopy (AFM).

It is further known from Thin Solid Films, 388 171-176 (2001), Valaski et al., that a layer of tin oxide made can be used that has been made from SnCl2 by means of CVD. However, in said document very smooth tin oxide layers are deposited with an average surface roughness of only 2.5 nm.

Further, Arias et al., in Thin Solid Films, 4\371 201-106 (2000) report a polymeric light emitting diode with tin oxide as a transparent electrode, but the influence of surface roughness to obtain diffused light was not reported.

The TCO layer in accordance with the present invention can be applied directly to a conventional substrate layer such as glass or ceramic glass or on a removable substrate.

The use of these substrates allows the use of a CVD process which makes it possible that cheaper transparent conductive oxides can be used and that the deposition processes can be carried out much faster. Additionally, it allows, in combination with the right amounts of materials to be used, the formation of a transparent conductive oxide layer having an increased but controlled roughness which of the active polymer layer.

Preferably, the present invention relates to a polymer optoelectronic device wherein the TCO layer has a controlled surface structure having an X-value is in the range of from 30 nm to 100 nm. The present optoelectronic device has preferably a Y-value is in the range of from 100 nm to 500 nm.

In the context of the present application, the standard deviation of the X-value and the Y-value is smaller than . . . %. Preferably, the standard deviation of the X-value and the Y-value is smaller than . . . %.

It has been found that polymer optoelectronic devices according to the present invention are especially attractive when they have a controlled surface structure having a ratio of the X-value and the Y-value (X/Y) is in the range of from 1/30 to 1. Preferably the X/Y ratio is in the range of from 1/7 to 1/2.

In the polymer optoelectronic devices in accordance with the present invention, a conducting polymer layer, if used, can be applied onto the transparent conductive oxide layer, and such conducting polymer layer has preferably a thickness in the range of from 10 to 1000 nm.

In the polymer optoelectronic devices according to the present invention, the active polymer layer is preferably applied onto a conducting polymer layer, and the active polymer layer has preferably a thickness in the range of from 10 to 500 nm. Such a conducting polymer layer may not be required when the active layer has a sufficient thickness.

Preferably, the polymer optoelectronic devices according to the present invention are flexible. Hence, a polymeric substrate layer will preferably be used instead of a conventional layer of glass.

The transparent conductive oxide (TCO) layer can suitably be applied onto the conventional substrate layer or the removable substrate layer by means of Atmospheric Pressure Chemical Vapour Deposition (APCVD), Low Pressure Chemical Vapour Deposition (LPCVD) or Plasma Enhanced Chemical Vapour Deposition (PECVD) processes. The TCO layer is preferably applied onto the conventional substrate layer or the removable substrate by means of a APCVD process. The TCO layer is suitably applied onto the conventional substrate layer or the removable substrate layer or one or more transparent layers previously applied onto the substrate layer at a temperature of at least 250° C., preferably at least 400° C., more preferably at a temperature in the range of from 450 to 550° C., and most preferably in the range of from 490 to 530° C. The application of such high temperatures allows the transparent conductive layer to obtain the desired properties. It improves the efficiency of the active polymer layer, whereas at the same time it improves its long-term performance because the TCO layer behaves as an attractive barrier layer.

The transparent conductive oxide layer may comprise one or more transparent conductive oxides selected from the group consisting of zinc oxide, tin oxide and/or indium tin oxide. Preferably, the transparent conductive oxide layer comprises zinc oxide and/or tin oxide. More preferably, the transparent conductive oxide layer comprises tin oxide. The transparent conductive oxide can be doped with a material such as aluminum, fluorine, gallium or boron. Most preferably, the transparent conductive oxide layer comprises tin oxide, which has been doped with fluorine. The thickness of the transparent conductive oxide layer can suitably be in the range of from 10 nm to 2000 nm, preferably in the range of from 450 nm to 850 nm.

The removable substrate layer can suitably be a foil of a metal or a metal alloy. Suitable metals include aluminum, titanium, copper, steel, iron, nickel, silver, zinc, molybdenum, chromium and alloys thereof. Preferably aluminum, copper or iron is used or an alloy thereof. Most preferably, use is made of aluminum or an alloy thereof. The removable substrate layer can suitably have a thickness in the range of from 5 micron to 1 mm, preferably in the range of from 50 micrometer to 200 micrometer.

The removable substrate layer can suitably be removed by means of an etching process. Suitably, in such etching process use is made of an acid or a base such as nitric acid, sulphuric acid, sodium hydroxide (NaOH) or potassium hydroxide (KOH). When the removable substrate layer comprises a foil of aluminum us is preferably made of sodium hydroxide (NaOH) or potassium hydroxide (KOH).

On the conventional or removable substrate layer one or more transparent layers may already been applied, before the transparent conductive oxide layer is applied. Such transparent layers include layers comprising $SiO_2$, $SiO_{2-x}$, $Al_2O_3$, $ZnO$, $ZrO_2$, $TiO_2$, $TiN$, $ZnS$, $SiO_xC_y$, $Si_3N_4$ and/or $SiO_xN_y$.

When the polymer optoelectronic device is inflexible, suitably use is made of a substrate, which comprises glass or ceramic glass.

When the polymer optoelectronic device is flexible use can suitably be made of a polymeric substrate layer. The polymeric substrate layer may contain several layers that can suitably comprise one or more polymeric materials selected from the group consisting of polyimids, polyamids, polyaramids, polyesters, polyolefins, liquid crystalline polymers (LCP), polycarbonates, polyacrylates, polymethacrylates, copolymers, blends of polymers and/or composites. The polymeric substrate layer may contain one or more types of polymers, but in practice it will be preferred to use one particular type of polymer. Preferably, the polymeric substrate layer comprises polyesters and/or polyolefins. More preferably, the polymeric substrate layer comprises polyethyleneterephthalate (PET) or polyethylenenaphthalate (PEN). The polymeric substrate layer can suitably have a thickness in the range of from 50 micrometers to 10 centimeters, preferably in the range of from 100 to 500 micrometer. The polymeric substrate layer can suitably be applied to the second electrode layer and/or the transparent conductive layer by means of lamination.

If applied, a conducting polymer layer can suitably comprise poly (3,4-dioxyethylenethiophene) or polyaniline. The conducting polymer layer can be applied onto the TCO layer by means of a spincoating or a printing process such as doctor blading, screenprinting or inkjet printing. Preferably, it is applied onto the TCO layer by means of a spincoating process. Suitably, the conducting polymer layer has a thickness in the range of from 10 to 1000 nm, preferably in the range of from 50 to 400 nm.

The active polymer layer can suitably comprise organic molecules such as dye molecules or fullerenes, or semiconducting polymers selected from the group consisting of polyanilines, polythiophenes, polypyroles, polyfluorenes, polyarylenes, polycabazoles, polyvinylcarbazoles, and derivatives, copolymers, and/or mixtures of these. The active polymer layer may contain one or more layers of the above named compounds, but in practice it will be preferred to use polyethylenedioxythiophene in one layer, whereas the second active polymer layer comprises the light emitting polymer or light harvesting layer. The active polymer layer can suitably have a thickness in the range of from 10 to 500 nm, preferably in the range of from 50 to 200 nm. The active polymer layer can suitably be applied onto the conducting polymer layer by means of spin coating or printing processes such as doctor blading, screenprinting or inkjet printing. The active polymer layer is preferably applied onto the conducting polymer layer at a temperature below 100° C.

The back electrode layer may comprise a low work function material such as calcium, barium, lithium fluoride, magnesium or yterbium covered with a layer of aluminum, silver or gold.

The back electrode layer can suitably have a thickness in the range of from 1 nm to 1 micrometer, preferably in the range of from 1 nm to 200 nm. The back electrode layer can suitably be applied onto the active polymer layer by means of sputtering or low-pressure vapour deposition. The back electrode layer is preferably applied onto the active polymer layer by means of a low-pressure vapour deposition process. A further substrate, preferably a polymeric substrate, can be applied onto the back electrode layer at a temperature below 100° C. This can be done by using a lamination process.

The transparent conductive oxide layer obtained in accordance with the present invention constitutes a very effective carrier layer, which improves the efficiency of the active polymer layer. In addition, it protects the active layer against water and oxygen.

As mentioned earlier, the polymer optoelectronic devices according to the present invention can for instance be used as solar cells or OLEDs.

Another advantage of the present polymer optoelectronic devices is that the controlled surface structure allows emission of diffused light. This is attractive for applications in the field of displays such as OLEDs.

The present invention also relates to a method for preparing the polymer optoelectronic device according to the present invention. Hence, the present invention also relates to a method for preparing the polymer optoelectronic device according to the present invention, wherein the transparent conductive layer is applied on a removable substrate layer or one or more transparent layers previously applied onto the removable substrate layer by means of a Chemical Vapour Deposition (CVD) process, and the removal carrier is removed when the substrate layer is applied.

Suitably, the present invention relates to a method comprising the steps of:
a) applying the transparent conductive oxide layer onto the removable substrate layer or on one or more transparent layers previously applied onto the removable substrate layer;
b) applying a conducting polymer layer onto the transparent conductive layer;
c) applying the active polymer layer onto the conducting polymer layer;
d) applying the back electrode layer onto the active polymer layer;
e) applying the substrate layer onto the back electrode layer; and
f) removing the removable substrate layer.

In another embodiment of the present invention, the method comprises the steps of:

a) applying the transparent conductive oxide layer onto the removable substrate layer;
b) applying, optionally, one or more transparent layers on the transparent conductive oxide layer;
c) applying the substrate layer onto the transparent conductive layer or the one or more transparent layers;
d) removing the removable substrate layer;
e) applying a conductive polymer layer onto the transparent conductive layer or the one or more transparent layers;
f) applying the active polymer layer onto the conducting polymer layer;
g) applying the back electrode layer onto the active polymer layer; and
h) applying a further substrate layer onto the back electrode layer.

The invention claimed is:

1. A method for preparing a polymer optoelectronic device comprising at least a transparent conductive oxide layer, an active polymer layer, a back electrode layer and a substrate layer, wherein the transparent conductive oxide (TCO) layer has a controlled surface structure which is characterized by having an X-value in the range of from 10 nm to 500 nm, and a Y-value in the range of from 15 to 1000 nm, wherein the ratio between the X-value and the Y-value (XJY) is at most 1, whereby the X-value is defined as the average value of the height of the peaks on the surface, the Y-value is defined as the average peak to peak distance on the surface, and both the X and Y values are measured by means of SEM (Scanning Electron Microscopy) or Atomic Force Microscopy (AFM),
wherein the transparent conductive layer is applied on a removable substrate layer or one or more transparent layers previously applied onto the removable substrate layer by means of a Chemical Vapour Deposition (CVD) process, and the removal carrier is removed when the substrate layer is applied.

2. A method according to claim 1 comprising the steps of:
a) applying the transparent conductive oxide layer onto the removable substrate layer or on one or more transparent layers previously applied onto the removable substrate layer;
b) applying a conducting polymer layer onto the transparent conductive layer;
c) applying the active polymer layer onto the conducting polymer layer;
d) applying the back electrode layer onto the active polymer layer;
e) applying the substrate layer onto the back electrode layer; and
f) removing the removable substrate layer.

3. A method according to claim 2 comprising the steps of:
a) applying the transparent conductive oxide layer onto the removable substrate layer; b) applying, optionally, one or more transparent layers on the transparent conductive oxide layer;
c) applying the substrate layer onto the transparent conductive layer or the one or more transparent layers;
d) removing the removable substrate layer;
e) applying a conductive polymer layer onto the transparent conductive layer or the one or more transparent layers;
f) applying the active polymer layer onto the conducting polymer layer;
g) applying the back electrode layer onto the active polymer layer; and
h) applying a further substrate layer onto the back electrode layer.

4. A method according to claim 1, wherein the transparent conductive oxide layer is applied onto the removable substrate layer at a temperature of at least 250° C.

5. A method according to claim 1, wherein the transparent conductive oxide layer is applied onto the removable substrate layer at a temperature of at least 400° C.

6. A method according to claim 1, wherein the transparent conductive oxide layer is applied onto the removable substrate layer at a temperature in the range of 450° C. to 550° C.

7. A method according to claim 1, wherein the transparent conductive oxide layer is applied onto the removable substrate layer at a temperature in the range of 490° C. to 530° C.

* * * * *

(12) EX PARTE REEXAMINATION CERTIFICATE (10297th)
United States Patent
van Mol et al.

(10) Number: US 7,749,780 C1
(45) Certificate Issued: Sep. 25, 2014

(54) POLYMER OPTOELECTRONIC DEVICE AND METHODS FOR MAKING THE SAME

(75) Inventors: Antonius Maria B. van Mol, Eindhoven (NL); Frank Theodorus J. Grob, Eindhoven (NL); Marinus Marc Koetse, Eindhoven (NL)

(73) Assignee: Nederlandse Organisatie Voor Toegepastnatuurwetenschappelijk Onderzoek Tno, VK Delft (NL)

Reexamination Request:
No. 90/020,045, Nov. 19, 2013

Reexamination Certificate for:
Patent No.: 7,749,780
Issued: Jul. 6, 2010
Appl. No.: 11/547,522
Filed: Nov. 28, 2006

(21) Appl. No.: 90/020,045

(22) PCT Filed: Apr. 1, 2005

(86) PCT No.: PCT/NL2005/000240
§ 371 (c)(1),
(2), (4) Date: Nov. 28, 2006

(87) PCT Pub. No.: WO2005/096405
PCT Pub. Date: Oct. 13, 2005

(51) Int. Cl.
*H01L 35/24* (2006.01)
*H01L 27/15* (2006.01)

(52) U.S. Cl.
USPC ............... 438/22; 438/82; 438/99; 257/40; 257/79; 257/103

(58) Field of Classification Search
None
See application file for complete search history.

(56) References Cited

To view the complete listing of prior art documents cited during the proceeding for Reexamination Control Number 90/020,045, please refer to the USPTO's public Patent Application Information Retrieval (PAIR) system under the Display References tab.

*Primary Examiner* — Erik Kielin

(57) ABSTRACT

The invention relates to a polymer optoelectronic device comprising at least a transparent conductive oxide layer, an active polymer layer, a back electrode layer and a substrate layer, wherein the transparent conductive oxide (TCO) layer has a controlled surface structure which is characterized by having an X-value in the range of from 10 nm to 500 nm, and a Y-value in the range of from 15 nm to 1000 nm, wherein the ratio between the X-value and the Y-value (X/Y) is at most 1, whereby the X-value is defined as the average value of the height of the peaks on the surface, the Y-value is defined as the average peak to peak distance on the surface, and both the X and Y values are measured by means of SEM (Scanning Electron Microscopy) or Atomic Force Microscopy (AFM).

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-7 are cancelled.

\* \* \* \* \*